US007950150B2

(12) United States Patent
Yoo et al.

(10) Patent No.: US 7,950,150 B2
(45) Date of Patent: May 31, 2011

(54) METHOD OF MANUFACTURING INKJET HEAD

(75) Inventors: Young-Seuck Yoo, Seoul (KR); Jae-Woo Joung, Suwon-si (KR); Sang-Jin Kim, Seoul (KR); Won-Chul Sim, Seongnam-si (KR); Chang-Sung Park, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 162 days.

(21) Appl. No.: 12/435,887

(22) Filed: May 5, 2009

(65) Prior Publication Data

US 2010/0050436 A1 Mar. 4, 2010

(30) Foreign Application Priority Data

Sep. 4, 2008 (KR) ........................ 10-2008-0087330

(51) Int. Cl.

| | |
|---|---|
| ***B21D 53/76*** | (2006.01) |
| ***B23P 17/00*** | (2006.01) |
| ***H01L 41/22*** | (2006.01) |
| ***H04R 17/00*** | (2006.01) |
| ***B41J 2/15*** | (2006.01) |
| ***B41J 2/145*** | (2006.01) |
| ***B28B 7/04*** | (2006.01) |

(52) U.S. Cl. ........... 29/890.1; 29/25.35; 347/40; 264/39

(58) Field of Classification Search ................. 29/890.1, 29/25.35; 347/20, 40, 44–45; 310/311, 316.01, 310/317; 264/39, 169

See application file for complete search history.

(56) References Cited

U.S. PATENT DOCUMENTS

| | | | | |
|---|---|---|---|---|
| 5,210,549 | A * | 5/1993 | Takahashi | 347/62 |
| 7,464,465 | B2 * | 12/2008 | Silverbrook | 29/890.1 |
| 7,506,442 | B2 * | 3/2009 | Shim et al. | 29/890.1 |
| 7,587,822 | B2 * | 9/2009 | Silverbrook | 29/890.1 |
| 7,631,427 | B2 * | 12/2009 | Silverbrook | 29/890.1 |
| 7,814,657 | B2 * | 10/2010 | Yokouchi | 29/890.1 |
| 7,862,734 | B2 * | 1/2011 | McAvoy et al. | 216/27 |
| 7,895,750 | B2 * | 3/2011 | Park et al. | 29/890.1 |
| 2007/0144003 | A1 * | 6/2007 | Silverbrook | 29/890.1 |

* cited by examiner

*Primary Examiner* — A. Dexter Tugbang
*Assistant Examiner* — David P Angwin
(74) *Attorney, Agent, or Firm* — McDermott Will & Emery LLP

(57) ABSTRACT

Disclosed is a method of manufacturing an inkjet head discharging ink. The method in accordance with an embodiment of the present invention can include: heating the inkjet head to a temperature over a melting point of a filler; filling the inkjet head with the filler such that a gap inside the inkjet head is filled with the filler; and discharging the filler out of the inkjet head such that the filler in the gap of the inkjet head remains.

3 Claims, 5 Drawing Sheets

METHOD OF MANUFACTURING INKJET HEAD

CROSS-REFERENCE TO RELATED APPLICATIONS

This application claims the benefit of Korean Patent Application No. 10-2008-0087330, filed with the Korean Intellectual Property Office on Sep. 4, 2008, the disclosure of which is incorporated herein by reference in its entirety.

BACKGROUND

1. Technical Field

The present invention relates to a method of manufacturing an inkjet head.

2. Description of the Related Art

An inkjet head performs printing by applying a driving force to a chamber formed inside the inkjet head and spraying ink droplets through a nozzle. The inkjet head includes a reservoir, which accommodates ink, a chamber, to which ink is supplied from the reservoir, a restrictor, which controls the flow of ink between the reservoir and the chamber, an actuator, which provides a sufficient pressure to the chamber, a membrane, which is interposed between the chamber and the actuator to transfer the pressure of the actuator to the chamber, and a nozzle, which is coupled to the chamber.

In order to manufacture the inkjet head, a number of plates are prepared and are joined together by use of polymer adhesive.

However, since the polymer adhesive may change its size or may not join the plates tightly enough, there may be a gap between the plates. Furthermore, a misalignment during the process of aligning the plates may also generate a gap between the plates.

If a gap is generated inside the inkjet head, bubbles may be generated during the process of filling the ink in the inkjet head. The bubbles inside the inkjet head deteriorates the performance of the inkjet head and reduces the manufacturing yield of the inkjet head owing to defect in the manufacturing process.

SUMMARY

The present invention provides a method of manufacturing an inkjet head that is capable of improving the performance and manufacturing yield of the inkjet head.

An aspect of the present invention features a method of manufacturing an inkjet head. The method in accordance with an embodiment of the present invention includes: heating the inkjet head to a temperature over a melting point of a filler; filling the inkjet head with the filler such that a gap inside the inkjet head is filled with the filler; and discharging the filler out of the inkjet head such that the filler in the gap of the inkjet head remains.

Here, the discharging of the filler can be performed by injecting compressed air into the inkjet head. The filler can be inert with respect to the ink.

DETAILED DESCRIPTION

Figure 1:
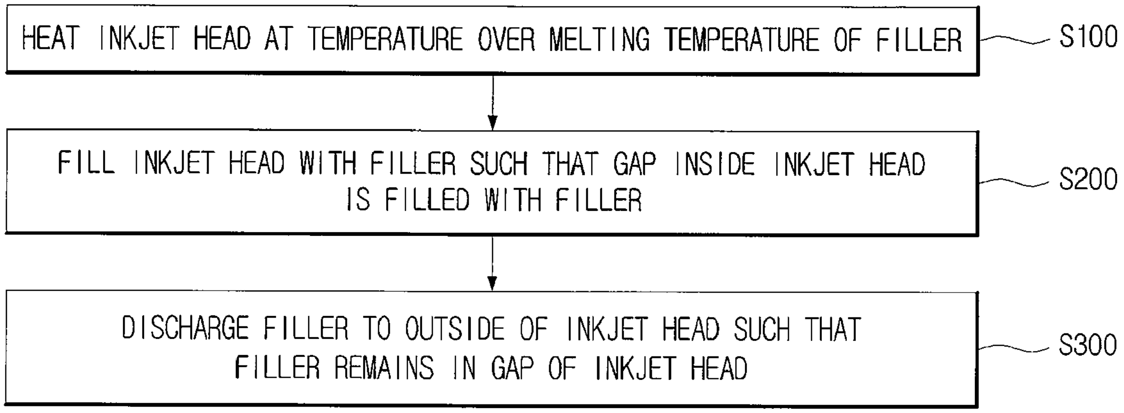
FIG. 1 is a flow diagram showing a method of manufacturing an inkjet head according to an embodiment of the present invention.

A characteristic and an advantage of the present invention will be clear with the following drawings and detailed description of the present invention.

Hereinafter, embodiments of a method of an inkjet head according to an embodiment of the present invention will be described in detail with reference to the accompanying drawings. In description with reference to accompanying drawings, the same reference numerals will be assigned to the same or corresponding elements, and repetitive descriptions thereof will be omitted.

FIG. 1 shows a flow diagram for a method of manufacturing an inkjet head 200 according to an embodiment of the present invention. FIGS. 2 through 5 are cross sectional views showing a method of manufacturing an inkjet head 200 according to an embodiment of the present invention.

Before describing an embodiment of the present invention, the structure of the inkjet head 200 will be described below with reference to FIG. 2.

A reservoir 204 accommodates ink 500 and provides the ink 500 to a chamber 208 through a restrictor 206, which will be described below. The reservoir 204 can be supplied with the ink 500 from the outside through an inlet port 218.

The reservoir 204 and the chamber 208 to be described below are linked to each other through the restrictor 206, which can function as a channel supplying the ink 500 from the reservoir 204 to the chamber 208. The restrictor 206 is formed to have a smaller cross section than that of the reservoir 204. As a result, if pressure is given to the chamber 208 by an actuator, it is possible to control the flow of the ink 500 supplied from the reservoir 204 to the chamber 208.

The chamber 208 is linked to the restrictor 206 and linked to the reservoir 204. There can be a plurality of chambers 208. The plurality of chambers 208 can be disposed in a line. The chamber 208 is linked to a nozzle 216 through a side that is not linked to the restrictor 206. Through the structure described above, the inkjet head 200 is supplied with and accommodates the ink 500, and provides the ink 500 to the nozzle 216, thereby performing the printing.

One surface of the chamber 208 is covered by a membrane 210. The actuator can be joined to the upper surface of the membrane 210 that correspond to the position of the chamber 208. The actuator can be, for example, a piezoelectric substance 212.

The piezoelectric substance 212 can be joined to the upper surface of the membrane 210 that correspond to the position of the chamber 208 and generate vibration by means of an electric power supply. The piezoelectric substance 212 can generate vibration in accordance with the voltage supplied thereto and provide pressure to the chamber 208 through the membrane 210.

The nozzle 216 is linked to the chamber 208 and receives the ink 500, and then is able to perform a function of discharging the ink 500. When the vibration generated by the piezoelectric substance 212 is provided to the chamber 208, the chamber 208 is pressed so that the pressure allows the ink 500 to be discharged through the nozzle 216.

The described configuration of the inkjet head 200 can be applied to a body 202 of the inkjet head 200. The body 200 can be formed by laminating a plurality of plates 202*a*, 202*b* and 202*c*. For example, as shown in FIG. 2, the body 202 can be formed by laminating a first plate 202*a*, in which a shape corresponding to the chamber 208, the restrictor 206 and an inlet port 218 is made, a second plate 202*b*, in which a shape corresponding to the reservoir 204 and a path 214 that links the nozzle 216 to the chamber 208 is made, and a third plate 202$c$, in which a shape corresponding to the nozzle 216 is made.

Each of the plates 202$a$, 202$b$ and 202$c$ can be made of a same material as the material used for a silicon wafer. The shape corresponding to the configuration of the inkjet head 200 can be formed in each of the plates 202$a$, 202$b$ and 202$c$ through a mechanical or physical process.

Figure 2:
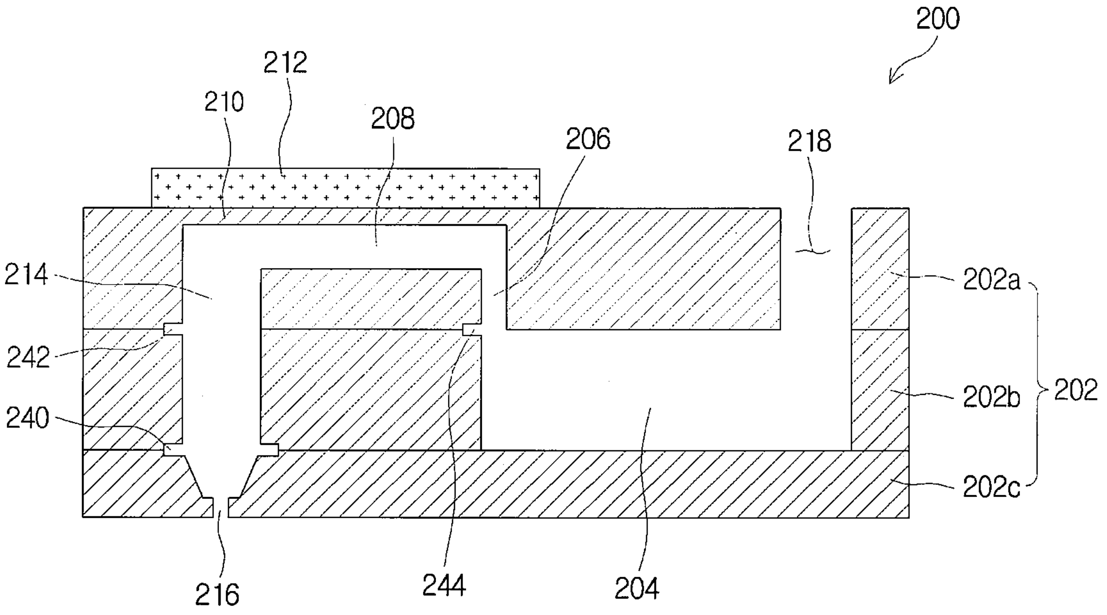
FIGS. 2 through 5 are cross sectional views showing a method of manufacturing an inkjet head according to an embodiment of the present invention.

As shown in FIG. 2, during the process of laminating the plates 202$a$, 202$b$ and 202$c$, there may occur gaps 240, 242 and 244 due to the described problems between the plates 202$a$, 202$b$ and 202$c$ in the manufacturing process.

The method of manufacturing the inkjet head 200 in accordance with an embodiment of the present invention includes a step (S100) of heating the inkjet head 200 to a temperature over a melting point of a filler 300, a step (S200) of filling the inkjet head 200 with the filler 300 such that the gaps 240, 242 and 244 inside the inkjet head 200 are filled with the filler, and a step (S300) of discharging the filler 300 out of the inkjet head 200 such that the filler 300 in the gaps 240, 242 and 244 of the inkjet head 200 remains. As a result, the gaps 240, 242 and 244, which may be generated between the interlayer structures of the inkjet head 200, are removed and bubbles due to the gaps inside the inkjet head 200 is prevented from being generated. Accordingly, it is possible to not only manufacture the inkjet head 200 having an improved performance but to increase the manufacturing yield of the inkjet head 200.

In order to manufacture the inkjet head 200 according to an embodiment of the present invention, the inkjet head 200 can be first heated to a temperature over a melting point of the filler 300 (S100). The filler 300 can be a kind of internal adhesive that is filled in the gaps 240, 242 and 244 inside the inkjet head 200 and is capable of removing the gaps 240, 242 and 244, which may be generated in the manufacturing process. The filler 300 can be either a liquid having high viscosity or a solid at room temperature. The filler 300 can also have an adhesive property.

The filler 300 may be inert with respect to the ink 500 used for the inkjet head 200. When the manufacture of the inkjet head 200 is completed, the filler 300 remains inside the inkjet head 200. Since the filler 300 is exposed to an environment allowing the inkjet head 200 to continuously be in contact with the ink 500, a material that does not react with the ink 500 can be used as the filler 300.

The filler 300 may have a melting point at which the filler 300 becomes fluid. The heating temperature of the inkjet head 200 can be a temperature at which the filler 300 becomes fluid enough to flow through the inside of the inkjet head 200 to fill up the gaps 240, 242 and 244. For example, the heating temperature can be over the melting point of the filler 300. For a filler 300 that is in a solid state at room temperature, the inkjet head 200 can be heated until the melting point is reached.

For a filler 300 that is in a highly viscous liquid state, the inkjet head 200 can be heated to a temperature at which the filler 300 becomes fluid enough such that the filler 300 can be easily filled in inkjet head 200. In this case, the heating temperature can be above room temperature.

The filler 300 can be, for example, wax or inert polymer, for which the heating temperature can be between 40 degrees Celsius and 200 degrees Celsius, at which the filler 300 can have a viscosity of between 4 cps and 50 cps. The inkjet head 200 can be heated directly or indirectly by use of, for example, a heater.

Figure 3:
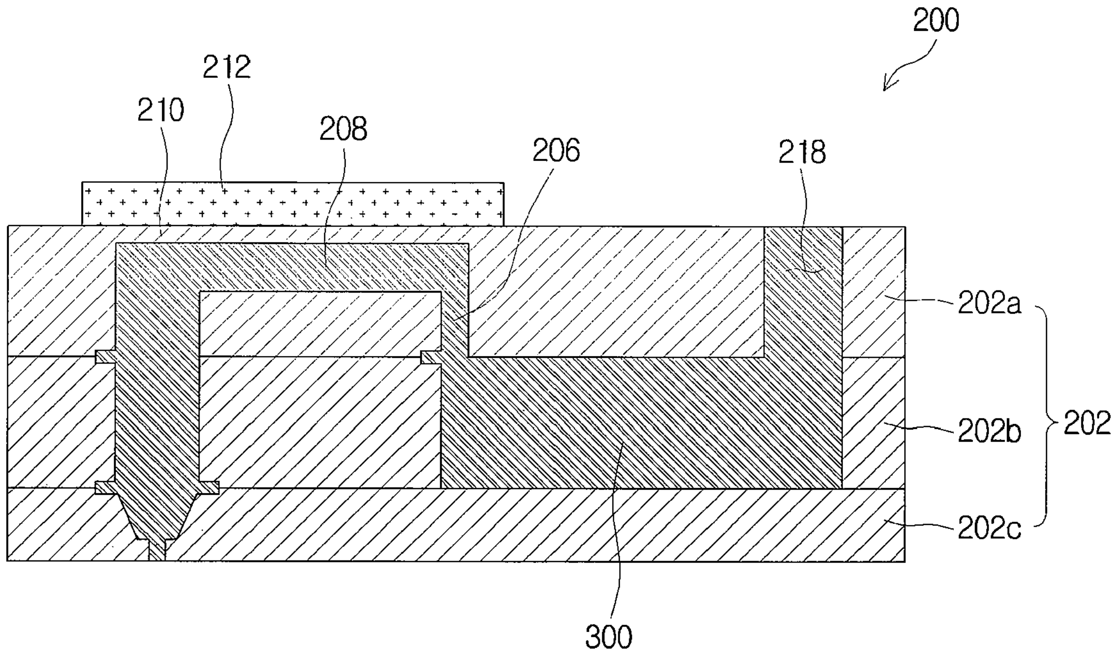

Next, as shown in FIG. 3, the inkjet head 200 can be filled with the filler 300 such that the gaps 240, 242 and 244 inside the inkjet head 200 are filled up (S200). The filler 300 can be filled in the inkjet head 200 through the inlet port 218 such that there is no empty space inside the inkjet head 200. In this case, the filler 300 can be sufficiently fluid such that the gaps 242, 242 and 244 inside the inkjet head 200 can be filled up. For example, the filler 300 can be in a state of having been heated to a temperature over the melting point.

Meanwhile, after filling the inkjet head 200 with the filler 300, the filler 300 can be more securely filled inside the inkjet head 200 by pressing the filler 300.

Figure 4:
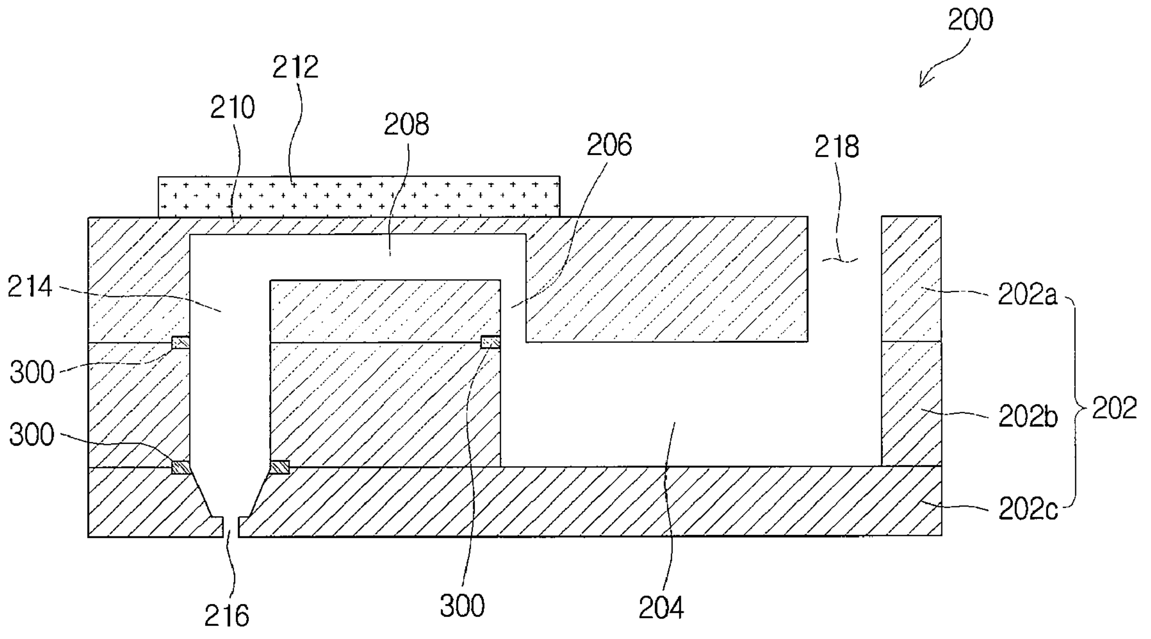

Then, as shown in FIG. 4, the filler 300 can be discharged out of the inkjet head 200 by injecting compressed air into the inkjet head 200 in a way that the filler 300 remains in the gaps 240, 242 and 244 of the inkjet head 200 (S300).

When the compressed air is injected through the inlet port 218 of the inkjet head 200, the filler 300 filled inside the inkjet head 200 can be discharged to the outside through the nozzle 216. In this case, the filler 300 filled in the gaps 240, 242 and 244 can remain in the gaps 240, 242 and 244 instead of being discharged through the nozzle 216.

Figure 5:
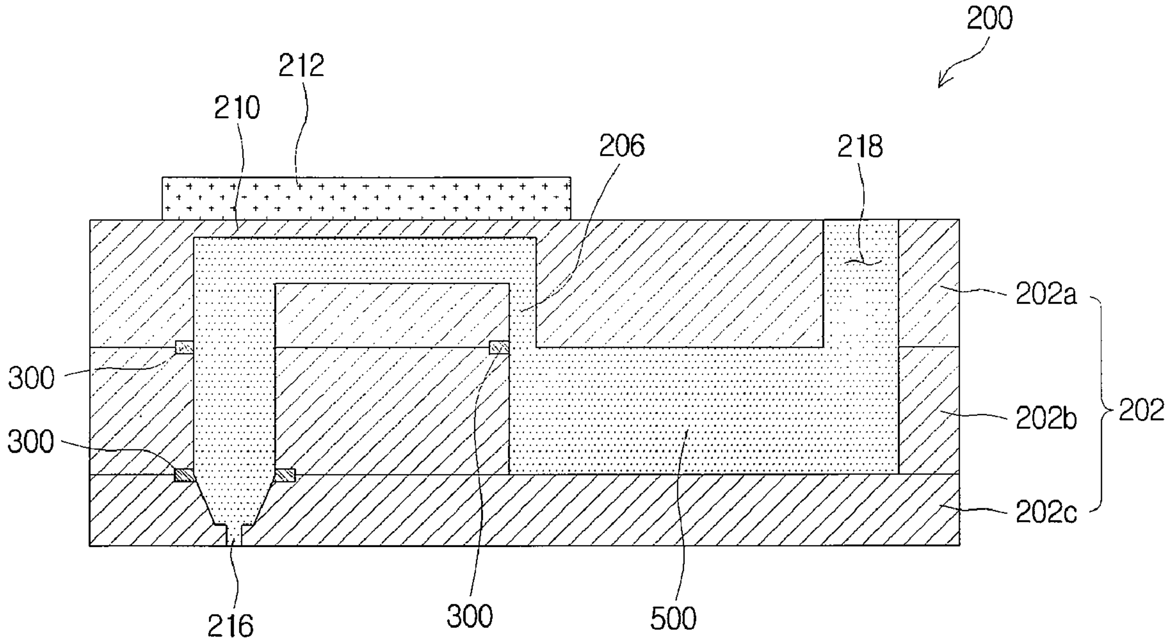

As shown in FIG. 5, the ink 500 can be filled inside the inkjet head 200. Since the filler 300 is inert with respect to the ink 500, the filler 300 can remain inside the inkjet head 200 without being dissolved in the ink 500.

Eventually, any unnecessary space inside the inkjet head 200 can be removed. As a result, the performance of the inkjet head 200 can be improved since bubbles that can be caused by the gaps 240, 242 and 244 inside the inkjet head 200 can be prevented from being generated. Moreover, since the defect in inkjet head due to the bubble generation inside the inkjet head 200 can be reduced, it is possible to increase the manufacturing yield.

While the present invention has been described with reference to exemplary embodiments thereof, it will be understood by those skilled in the art that various changes and modification in forms and details may be made without departing from the spirit and scope of the present invention as defined by the appended claims.

What is claimed is:

1. A method of manufacturing an inkjet head discharging ink, the method comprising:

heating the inkjet head to a temperature over a melting point of a filler;

filling the inkjet head with the filler such that a gap inside the inkjet head is filled with the filler; and discharging the filler out of the inkjet head such that the filler in the gap of the inkjet head remains.

2. The method of claim 1, wherein the discharging of the filler is performed by injecting compressed air into the inkjet head.

3. The method of claim 1, wherein the filler is inert with respect to the ink.

* * * * *